(12) United States Patent
Trimberger

(10) Patent No.: US 7,278,128 B1
(45) Date of Patent: Oct. 2, 2007

(54) METHOD OF ALTERING A BITSTREAM

(75) Inventor: Stephen M. Trimberger, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 431 days.

(21) Appl. No.: 10/820,337

(22) Filed: Apr. 8, 2004

Related U.S. Application Data

(60) Provisional application No. 60/462,477, filed on Apr. 11, 2003.

(51) Int. Cl.
*G06F 17/50* (2006.01)
(52) U.S. Cl. .................................................. 716/17
(58) Field of Classification Search ................. 716/17
See application file for complete search history.

(56) References Cited

U.S. PATENT DOCUMENTS 5,361,266 A * 11/1994 Kodama et al. ............ 714/758
5,577,053 A * 11/1996 Dent .......................... 714/755
5,933,023 A    8/1999 Young
5,946,478 A * 8/1999 Lawman .................... 716/17
5,978,814 A * 11/1999 Miller et al. ............... 707/203
6,034,958 A * 3/2000 Wicklund .............. 370/395.32
6,654,889 B1   11/2003 Trimberger

OTHER PUBLICATIONS

U.S. Appl. No. 09/724,652, filed Nov. 28, 2000, Pang et al.
U.S. Appl. No. 10/199,535, filed Jul. 18, 2002, Trimberger.
U.S. Appl. No. 10/112,838, filed Mar. 29, 2002, Trimberger.
U.S. Appl. No. 10/104,324, filed Mar. 22, 2002, Wells et al.
Bruce Schneier, "Applied Cryptography: Protocols, Algorithms and Source Code in C" 1996, pp. 456-459, Second Edition, available from John Wiley & Sons, Inc. Corporate Headquarters, 111 River Street, Hoboken, NJ 07030.

* cited by examiner

*Primary Examiner*—Jack Chiang
*Assistant Examiner*—Brandon Bowers
(74) *Attorney, Agent, or Firm*—Arthur J. Behiel; LeRoy D. Maunu

(57) ABSTRACT

A method is disclosed for redeploying an FPGA that has been restricted for use with a first design. The FPGA accepts only those configuration bitstreams whose CRC checksums match a value stored on the FPGA. The restricted FPGA is used with a second configuration bitstream for a second design by altering the second configuration bitstream so that it generates a CRC checksum that matches the value stored on the FPGA. The first checksum is derived by applying a CRC hash function to the first configuration bitstream. The second configuration bitstream is altered so that the second checksum generated when the CRC hash function is applied to the altered second configuration bitstream is identical to the first checksum. Altering the second configuration bitstream can result in an altered second configuration bitstream that is either longer than or the same length as the second configuration bitstream.

10 Claims, 8 Drawing Sheets

```
                                              1010 0000 1011 0101
1 0001 0000 0010 0001 )1010 1010 1010 1010 1010 1010 1010 1010
         ↑             1000 1000 0001 0000 1
     GENERATOR         0010 0010 1011 1010 001              FIRST
     POLYNOMIAL          10 0010 0000 0100 001          CONFIGURATION
                         00 0000 1011 1110 0000 1010 1     BITSTREAM
                            1000 1000 0001 0000 1
                            0011 0110 0001 1010 001
                              10 0010 0000 0100 001
                              01 0100 0001 1110 0000
                               1 0001 0000 0010 0001
                               0 0101 0001 1100 0001 10
                                 100 0100 0000 1000 01
                                 001 0101 1100 1001 1110
                                   1 0001 0000 0010 0001
                                   0 0100 1100 1011 1111
                                              ↖
                                             FIRST
                                           SIGNATURE
```

FIG. 4A

```
0 0100 1100 1011 1111 ← FIRST SIGNATURE
0 0110 0011 1010 0011 ← INTERMEDIATE REMAINDER
0 0010 1111 0001 1100 ← FORCING VALUE
```

FIG. 4C

METHOD OF ALTERING A BITSTREAM

FIELD OF THE INVENTION

The present invention relates to programmable logic devices, and more particularly, to methods and circuits for enabling PLD manufacturers to dedicate PLDs for use with specified designs.

BACKGROUND OF THE INVENTION

Programmable logic devices (PLDs), such as field-programmable gate arrays (FPGAs), are user-programmable integrated circuits that can be programmed to implement user-defined logic circuits. In a typical FPGA architecture, an array of configurable logic blocks (CLBs) and a programmable interconnect structure are surrounded by a ring of programmable input/output blocks (IOBs). The programmable interconnect structure comprises interconnects and configuration memory cells. Each of the CLBs and the IOBs also includes configuration memory cells. The content of the configuration memory cells determines how the CLBs, the IOBs and the programmable interconnect structure are configured. Additional resources, such as multipliers, block random access memory (BRAM) and microprocessors are also included on an FPGA for use in user-defined circuits. An exemplary FPGA architecture is described by Young in U.S. Pat. No. 5,933,023, entitled "FPGA Architecture Having RAM Blocks with Programmable Word Length and Width and Dedicated Address and Data Lines," which is incorporated herein by reference.

To realize a user-defined circuit, a configuration bitstream is loaded into the configuration memory cells such that the CLBs and IOBs are configured to implement particular circuit components used in the user-defined circuit. A configuration bitstream is also loaded into the configuration memory cells of the programmable interconnect structure such that the programmable interconnect structure connects the various configured CLBS and IOBs in a desired manner to realize the user-defined circuit.

PLDS are not design specific, but instead afford customers (e.g., circuit designers) the ability to instantiate an almost unlimited number of circuit variations. However, in some cases, it can be desirable to restrict or dedicate a PLD to a particular design, and prevent the use of other designs on that PLD.

For instance, not knowing in advance the purpose to which a given PLD will be dedicated places a heavy burden on the quality and reliability of the PLD because PLD manufacturers must verify the functionality of all advertised features. To avoid disappointing customers, PLD manufacturers discard PLDs that include even relatively minor defects.

Furthermore, PLDs are growing ever larger as manufacturers attempt to satisfy customer demand for devices capable of performing ever more complex tasks. The probability that a particular PLD will contain a defect increases as the die size of the PLD increases. Therefore, process yield decreases with increasing PLD size. PLD defects can be categorized in two general areas: gross defects that render an entire PLD useless or unreliable, and localized defects that affect a relatively small portion of a PLD. It has been found that, for large dice, nearly two thirds of the dice on a given wafer may be discarded because of localized defects. Considering the costs associated with manufacturing large integrated circuits, discarding a large percentage of PLD dice significantly increases the effective cost per unit of the remaining PLDS that are sold.

This yield problem can be mitigated using methods that allow PLDS with limited defects to be sold only to selected customers who will not be disappointed with the specific localized defects in such PLDS. In one such method, PLDs are tested to determine whether they are suitable to implement selected customer designs. As each individual PLD can have different manufacturing defects, a PLD that is found to be unsuitable for one design can, nevertheless, be tested for suitability for additional designs. These test methods typically employ test circuits derived from a customer design and instantiated on the individual PLD of interest to verify resources required for the design. The test circuits thus allow PLD manufacturers to verify the suitability of an individual PLD for a specific design.

A PLD manufacturer may want to prevent customers from using such a specially tested PLD for designs other than the tested design. In addition, if purchasers of such PLDs resell them on the "gray market" without indicating that the PLDs are limited to a specific design, the PLD manufacturer's reputation for quality can be harmed. U.S. patent application Ser. No. 10/199,535 entitled "Methods and Circuits for Dedicating a Programmable Logic Device for Use with Specific Designs," by Stephen M. Trimberger, which is incorporated herein by reference, discloses a method for applying a digital signature to configuration bitstreams of tested PLDs to restrict the use of the PLDs to the tested designs. The digital signature of a tested design is burned into the tested PLD as an unchangeable value, for example, by programming the digital signature into an antifuse-based one-time-programmable (OTP) memory.

In some cases, it may be desirable to redeploy PLDs that are restricted to accepting a configuration bitstream whose digital signature matches the preset, unchangeable value. For example, a PLD manufacturer may want to repurchase surplus restricted PLDs from one customer and resell those restricted PLDs to a new customer together with a new configuration bitstream for a new design. In another example, a customer that has purchased a PLD dedicated to a particular design may want to use that PLD with an altered or different design. In such instances, in order for the PLD to function with the new configuration bitstream, the digital signature of the new configuration bitstream must match the unchangeable value stored on the PLD. It is, therefore, desirable to force the digital signature of a configuration bitstream to a desired value.

SUMMARY

A method is disclosed for forcing a PLD restricted for use with a first circuit design to accept a second circuit design. The PLD is restricted for use with the first design by storing a signature value derived from the bitstream specifying the first design. The PLD performs a hash function on any received configuration bitstream and compares the resulting hash value with the signature value; the PLD only works with those configuration bitstreams having a hash value that matches the store signature value.

The PLD rejects a bitstream specifying a second design where applying the hash function to that bitstream does not yield the correct signature value. The second bitstream is therefore modified in accordance with one embodiment to yield the same hash result as the first bitstream, causing the PLD to accept the second circuit.

In accordance with one embodiment, the hash function is applied to the first bitstream to derive the signature value stored in the PLD. Next, the same hash function is applied to the second bitstream to produce an intermediate remainder, which is then used to alter the second configuration bitstream to produce the signature value in response to the hash function. The alterations to the second bitstream are selected so that they do not alter the portion of the second bitstream specifying the second design. The restricted PLD can then be configured using the altered second bitstream to instantiate the second circuit.

In one embodiment, altering the second configuration bitstream results in an altered second configuration bitstream that is longer than the second configuration bitstream. In another embodiment, where the PLD is also restricted for use with a configuration bitstream of a specific length, altering the second configuration bitstream results in an altered second configuration bitstream that is the same length as the first configuration bitstream.

A circuit is disclosed for altering a configuration bitstream to generate an altered configuration bitstream. The result of applying a hash function to the altered configuration bitstream is a digital signature that is identical to a signature value stored in non-volatile memory on a restricted PLD. The circuit contains a register with exclusive OR gates at positions in the register that correspond to coefficients of a generator polynomial used by the hash function.

Additional novel aspects and embodiments are described in the detailed description below. The allowed claims, and not this summary, define the scope of the invention.

BRIEF DESCRIPTION OF THE DRAWINGS

The accompanying drawings, where like numerals indicate like components, illustrate embodiments of the invention.

FIGS. 4A-D are tables showing sample calculations performed in the operation of the digital signature forcing circuit of FIG. 2.

DETAILED DESCRIPTION OF THE DRAWINGS

Figure 1:
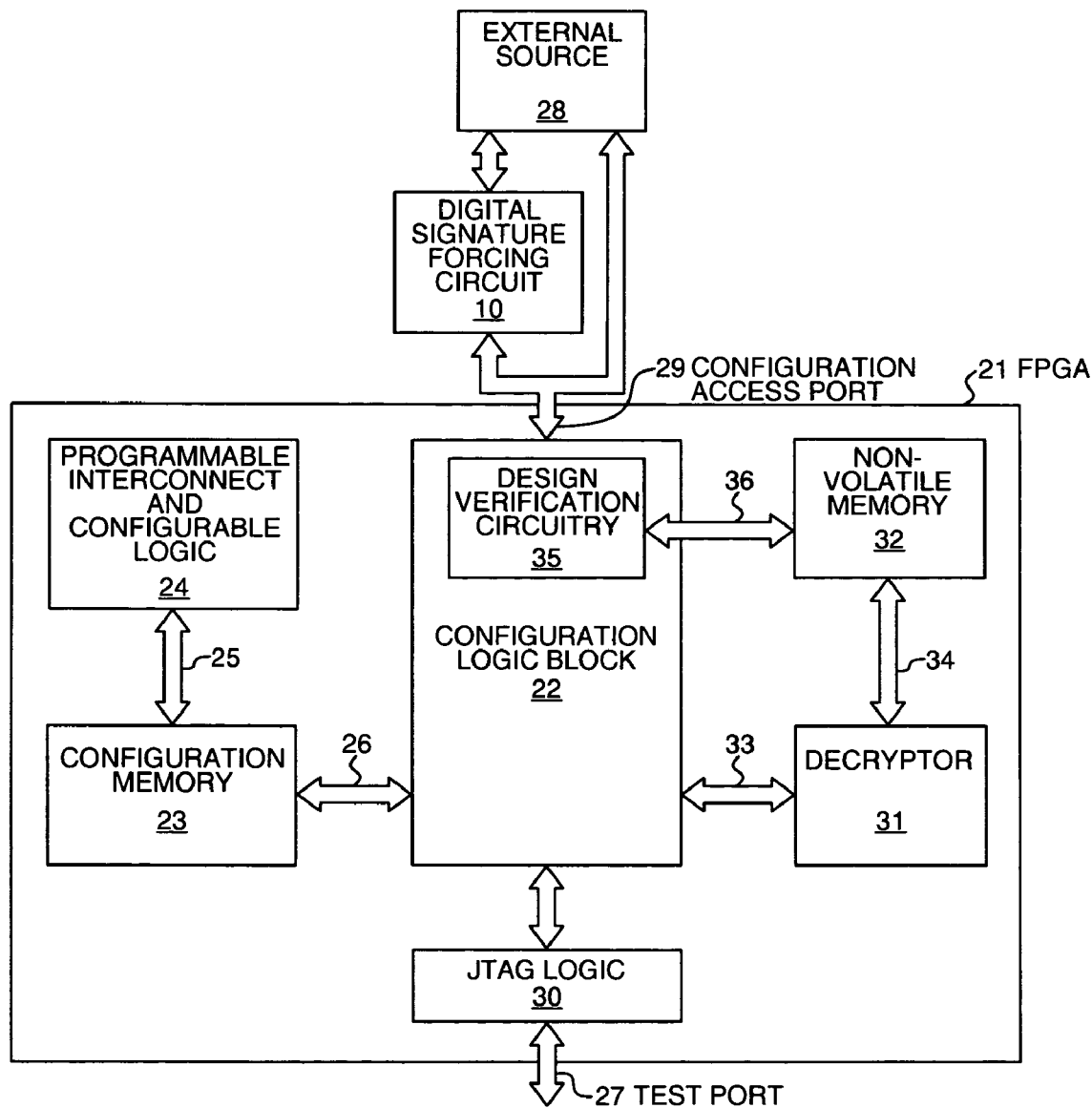
FIG. 1 is a simplified block diagram of a digital signal forcing circuit for use with an FPGA.

FIG. 1 depicts an FPGA 21 that can be dedicated for use with specific, authorized circuit designs. FPGA 21 performs a hash function on each configuration bitstream and rejects those that fail to produce a hash result matching a stored signature value. A digital signature forcing circuit 10, in accordance with one embodiment, alters unauthorized configuration bitstreams (i.e., those having a hash result that does not correspond to the signature stored in FPGA 21) to produce the stored signature value in response to the hash function. The alterations do not affect the functionality specified by unauthorized bitstreams, so FPGA 21 can be configured to instantiate designs that would otherwise be rejected.

FPGA 21 contains a configuration logic block 22, configuration memory 23, and programmable interconnect and configurable logic (programmable logic) 24. Configuration memory 23 controls the function of programmable logic 24 via a distributed set of logic control lines 25. Configuration logic block 22 receives an expression of a first customer design as a first configuration bitstream that includes instructions and data. Configuration logic block 22 processes the data according to the instructions to load configuration memory 23, via a bus 26, as appropriate to instantiate the desired logic design in programmable logic 24. Configuration logic block 22 can receive the first configuration bitstream through a test port 27, but more commonly receives the configuration bitstream from some external data source 28 (e.g., a PROM) through a dedicated configuration access port 29. Configuration logic block 22 interfaces with test port 27 through a joint test action group (JTAG) logic block 30, whose resources are especially intended for testing the board on which FPGA 21 will be placed. JTAG logic block 30 facilitates debugging of a design at the board level.

Anyone with access to the first configuration bitstream can easily copy the corresponding design. FPGA 21 is therefore equipped with a decryptor 31 and associated non-volatile memory 32, which together enable customers to configure FGPA 21 using encrypted configuration bitstreams. Configuration logic block 22 conveys the encrypted first configuration bitstream to decryptor 31 via a bus 33. Decryptor 31 then accesses a decryption key stored in non-volatile memory 32 over a memory access bus 34, employs the key to decrypt the first configuration bitstream, and then returns the decrypted first configuration bitstream to configuration logic block 22 via bus 33. For a more detailed treatment of configuration bitstream decryption and other configuration-data security issues, see U.S. patent application Ser. No. 10/112,838 entitled "Methods and Circuits for Protecting Proprietary Configuration Data for Programmable Logic Devices," by Stephen M. Trimberger, and U.S. patent application Ser. No. 09/724,652, entitled "Programmable Logic Device With Decryption Algorithm and Decryption Key," by Pang et al., both of which are incorporated herein by reference.

Configuration logic block 22 includes design verification circuitry 35 that allows FPGA 21 to be dedicated for use with specific, authorized customer designs. Design verification circuitry 35 can be programmed to reject configuration bitstreams that do not produce the same first digital signature as does the authorized first configuration bitstream defining the authorized first design. U.S. patent application Ser. No. 10/104,324 entitled "Application-Specific Testing Methods for Programmable Logic Devices," by Robert W. Wells, et al. is incorporated herein by reference and describes some methods of identifying FPGAs with minor manufacturing defects that might nevertheless function when programmed with specific customer designs.

Design verification circuitry 35 connects to non-volatile memory 32 via a bus 36. FPGA 21 is dedicated for use with the first design by storing the first digital signature in non-volatile memory 32. Non-volatile memory 32 can be any form of available non-volatile memory, but preferably is one-time programmable. The first digital signature is the result of performing a hash function on the first configuration bitstream. A register within non-volatile memory 32 is programmed with the first digital signature, typically by the FPGA manufacturer. When the customer uses FPGA 21 with the first design, design verification circuitry 35 performs the hash function on the first configuration bitstream and enables FPGA 21 because the hash result matches the first digital signature stored in memory 32.

Hash functions are well known to those of skill in the art. For a more detailed discussion of how to perform a hash function on a design to develop a unique identifier for the design, see U.S. application Ser. No. 09/253,401 entitled "Method and Apparatus for Protecting Proprietary Configuration Data for Programmable Logic Device," by Stephen M. Trimberger, which is incorporated herein by reference. In addition, "Applied Cryptography, Second Edition," (1996) by Schneier, beginning at page 456, describes a way to make a key-dependent one-way hash function by encrypting a message with a block algorithm in the CBC mode, as specified in ANSI X9.9, a United States national wholesale banking standard for authentication of financial transactions. ANSI X9.9 is incorporated herein by reference.

In an embodiment, a first configuration bitstream upon which the hash function is performed is a configuration bitstream for a field programmable gate array. The hash function that produces the first digital signature is a frame check sequence (FCS) algorithm called cyclic redundancy check (CRC). In some embodiments, the ITU-TSS CRC method is used, which employs the X25 standard having a generator polynomial for a 16-bit checksum. (A generator polynomial for an n-bit checksum is sometimes referred to as an n-bit polynomial, although the binary number corresponding to the n-bit polynomial has n+1 bits.) The 16-bit polynomial employed by the X25 standard is $G(x)=x^{16}+x^{12}+x^5+1$. Other embodiments can use other polynomials, such as the 16-bit polynomial $G(x)=x^{16}+x^{15}+x^2+1$, which is based on the "CRC-16" protocol. Alternatively, a 32-bit generator polynomial can be used, such as $G(x)=x^{32}+x^{26}+x^{23}+x^{22}+x^{16}+x^{12}+x^{11}+x^{10}+x^8+x^7+x^5+x^4+x^2+x^1+1$, which is based on the Ethernet 802.5 standard.

Figure 2:
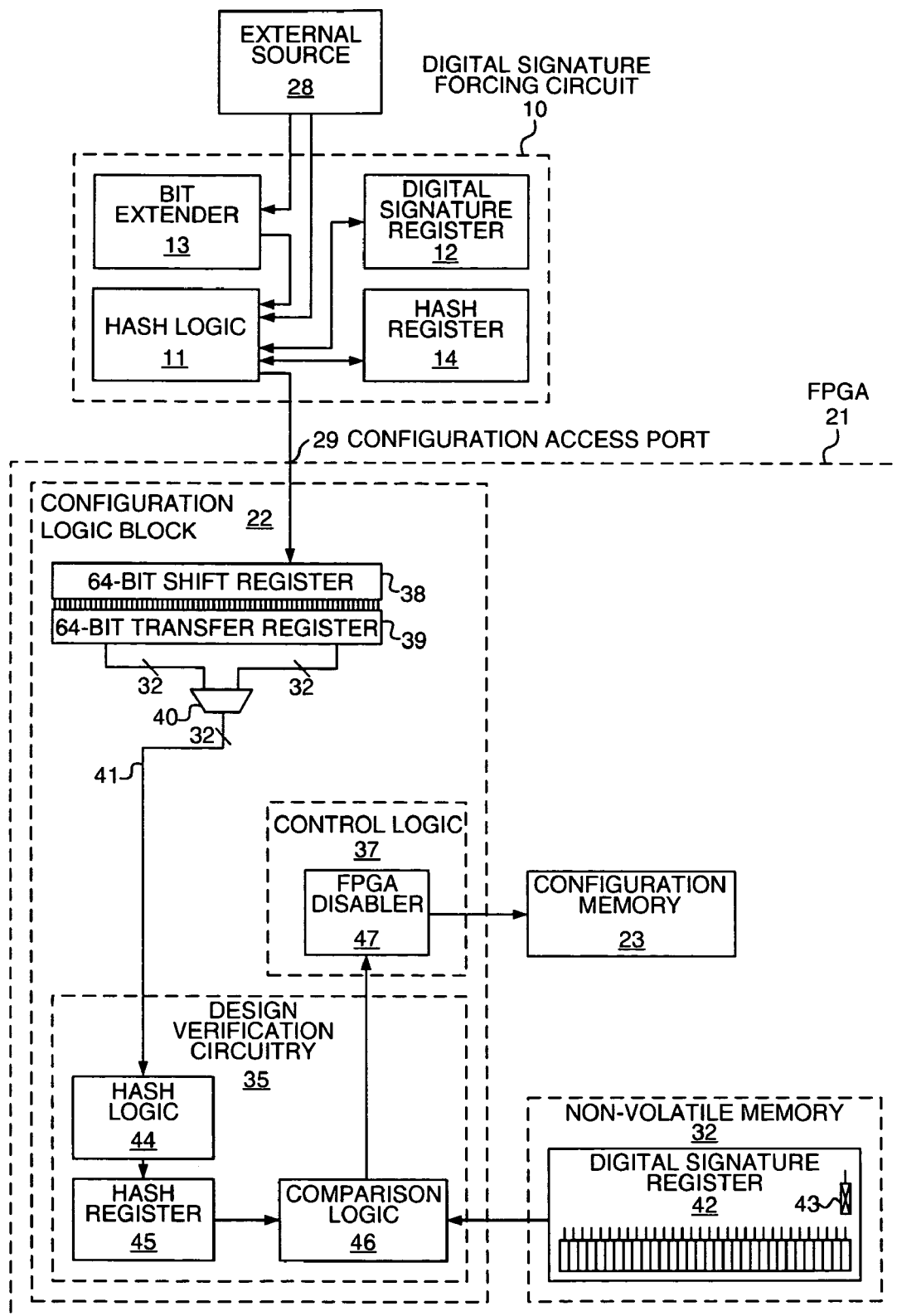
FIG. 2 is a more detailed block diagram of the digital signal forcing circuit and the FPGA.

FIG. 2 is a block diagram detailing aspects of digital signature forcing circuit 10 and FPGA 21 that are of particular relevance in the procedure for restricting FPGA 21 for use with the first design and then redeploying FPGA 21 for use with a second design. FIG. 2 includes expanded views of digital signature forcing circuit 10, configuration logic block 22 and non-volatile memory 32. Configuration logic block 22 includes structures to prevent design reallocation, including design verification circuitry 35 and control logic 37.

Non-volatile memory 32 includes a register 42 adapted to store the first digital signature. Register 42 also includes an extra memory cell 43 that is programmed to include a logic one if FGPA 21 is dedicated for use with a specified design. As is known in the art, a logic zero can also be used with straightforward changes.

A PLD manufacturer receives the first design from a customer and can employ design-specific tests to determine whether FPGA 21 functions with the first design. If FPGA 21 is fully functional with the first design, a hash function is performed, frame-by-frame, on configuration bitstream defining the first design (i.e., the first configuration bitstream). The PLD manufacturer then stores the hash result, a "first digital signature," within digital signature register 42 of non-volatile memory 32. At the same time, memory cell 43 is loaded with a logic one to enable design verification circuitry 35. FPGA 21 is thus dedicated for use with the first design.

There is a low probability that a random second configuration bitstream will produce the first digital signature in response to the hash function. The probability that two random configuration bitstreams will produce the same CRC checksum when the CRC algorithm employs a 32-bit generator polynomial is 1 in $(2^{32}-1)$ (since a CRC checksum of zero is not typically used).

FIG. 2 also shows a pair of registers 38 and 39 in configuration logic block 22. Register 38 is a 64-bit shift register that receives portions of configuration bitstreams from configuration access port 29. Configuration access port 29 can be a single pin for one-bit-wide data, eight pins for eight-bit-wide data, or any other width. Portions of configuration bitstreams are loaded into register 38 until register 38 is full. These 64 bits (in register 38) are then shifted in parallel into 64-bit transfer register 39. From there, a multiplexer 40 alternately selects right and left 32-bit words, and the data is output as 32-bit words on bus 41. Design verification circuitry 35 receives portions of configuration bitstreams from multiplexer 40 and operates on the configuration bitstreams 32 bits at a time.

Design verification circuitry 35 includes hash logic 44, hash register 45, and comparison logic 46. The output of comparison logic 46 is coupled to control logic 37. Control logic 37 contains an FPGA disabler 47 that aborts the configuration operation of FPGA 21 when FPGA disabler 47 receives a disable signal asserted by comparison logic 46. To abort the configuration operation, FPGA disabler 47 can clear configuration memory 23 by overwriting it with all zeroes or another disabling pattern. One input of design verification circuitry 35 connects to memory cell 43 in memory 32. By programming memory cell 43 to store a logic zero, design verification circuitry 35 is prevented from sending a disable signal to control logic 37 and is thereby prevented from aborting the configuration operation. Thus, by programming memory cell 43 to store a logic zero, design verification circuitry 35 can be disabled, and FGPA 21 is not limited to a design having a specific configuration bitstream.

Returning to an example in which FPGA 21 is dedicated for use with a specific design (and memory cell 43 is programmed with a logic one), hash logic 44 performs a CRC algorithm on any received bitstreams and stores the resulting CRC checksum in hash register 45. Comparison logic 46 then compares the CRC checksum in hash register 45 with the first digital signature in register 42. Any mismatch between corresponding bits of hash register 45 and digital signature register 42 asserts a disable signal on the output of comparison logic 46, flagging an unauthorized bitstream to control logic 37. In response to the disable signal, control logic 37 aborts the configuration operation.

A PLD manufacturer can redeploy FPGA 21 for use with a second tested design by using digital signature forcing circuit 10. For example, a PLD manufacturer can repurchase restricted FPGA 21 from one customer and resell restricted FPGA 21 to a new customer together with a second configuration bitstream for the second design, provided the digital signature of the second configuration bitstream matches the first digital signature stored in memory 32. As noted above, the probability that a second configuration bitstream will produce the stored digital signature is extremely remote; however, signature forcing circuit 10 alters configuration bitstreams to produce digital signatures identical to a stored signature.

Figure 3:
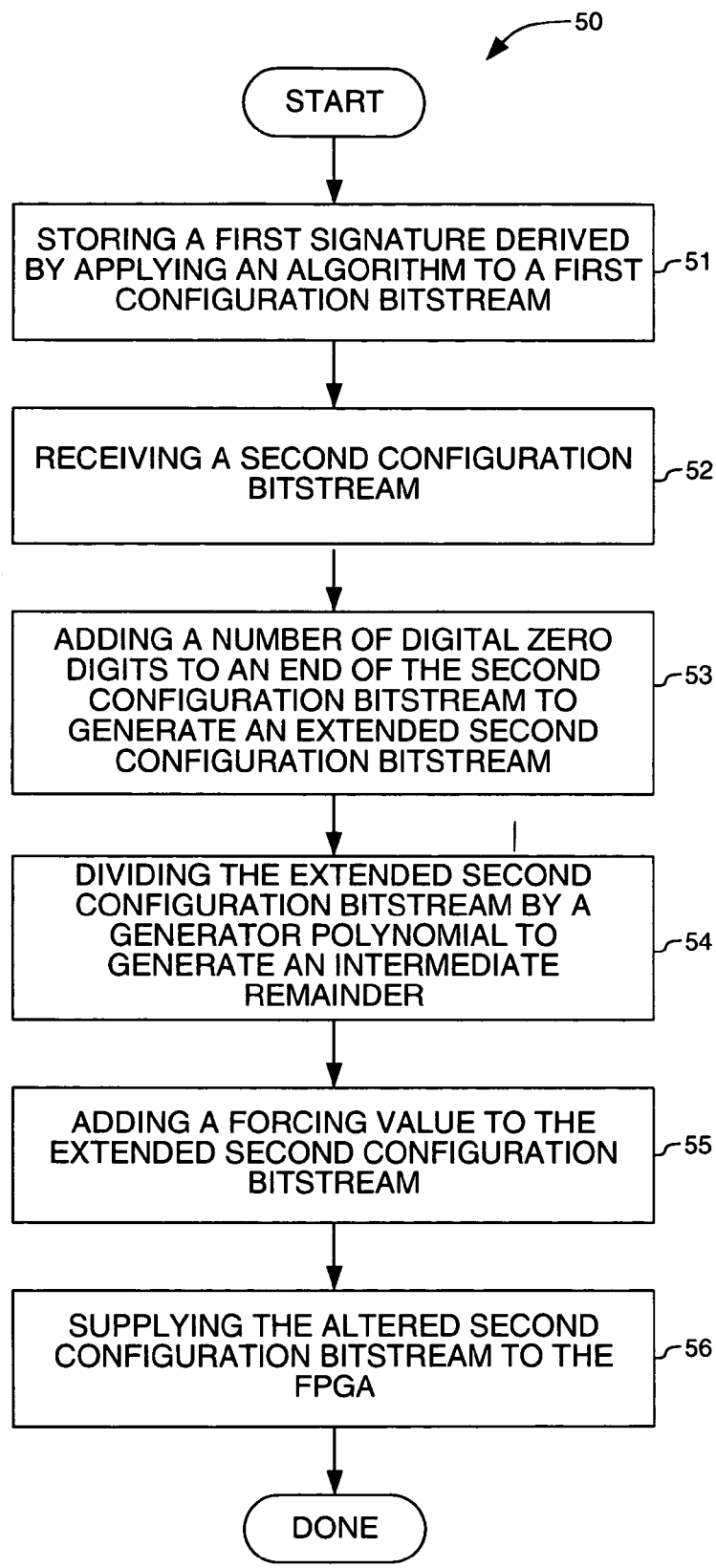
FIG. 3 is a flowchart of the steps of operation of one digital signature forcing circuit.

FIG. 3 is a flowchart 50 depicting the operation of digital signature forcing circuit 10. Flowchart 50 is described in connection with digital signature forcing circuit 10 of FIG. 2 to illustrate how an embodiment of the invention facilitates using FPGA 21 with the second design after FPGA 21 has been dedicated for use with the first design.

In a first step 51, the CRC algorithm is applied by hash logic 11 to the first configuration bitstream to obtain the first digital signature, which is then stored in digital signature register 12 of digital signature forcing circuit 10. In this example, the CRC algorithm is applied by dividing the first configuration bitstream by the 16-bit generator polynomial $G(x)=x^{16}+x^{12}+x^5+x^0$ using modulo-2 division. (Step 51 is unnecessary if one has other access to the first digital signature.)

In step 52, digital signature forcing circuit 10 receives the second configuration bitstream corresponding to the second design.

In step 53, bit extender 13 adds a number of digital zero digits to the least significant digit of the second configuration bitstream, thereby generating an extended second configuration bitstream. In an example where the generator polynomial $x^{16}+x^{12}+x^5+x^0$ (represented as 1 0001 0000 0010 0001) is used, sixteen digital zero digits are appended to the end of the second configuration bitstream.

In step 54, hash logic 11 applies the CRC algorithm to the extended second configuration bitstream. Step 54 produces an intermediate remainder, which is stored in hash register 14 of digital signature forcing circuit 10. As in step 51, the CRC algorithm is applied by dividing by the 16-bit generator polynomial $G(x)=x^{16}+x^{12}+x^5+x^0$ using modulo-2 division.

In step 55, a forcing value is added to the extended second configuration bitstream to form an altered second configuration bitstream. The forcing value is the sum of the intermediate remainder stored in hash register 14 and the first digital signature stored in digital signature register 12. The sum is obtained using modulo-2 addition.

In step 56, the altered second configuration bitstream is supplied to FPGA 21.

The altered second configuration bitstream can then be used to configure FPGA 21. FPGA 21 receives the altered second configuration bitstream from digital signature forcing circuit 10 through configuration access port 29. Alternatively, FPGA 21 can receive the altered second configuration bitstream through test port 27 (as shown in FIG. 1). In the process of configuring FPGA 21 using altered second configuration bitstream, design verification circuitry 35 receives the altered second configuration bitstream as a series of 32-bit words, and hash logic 44 performs the CRC algorithm to obtain a CRC checksum, the second digital signature. The second digital signature is identical to the first digital signature and is stored in hash register 45. Comparison logic 46 then compares the second digital signature with the first digital signature in register 42, and the digital signatures match. The disable signal output of comparison logic 46 is, therefore, not asserted, and control logic 37 does not abort the configuration operation.

The digits of the forcing value that are added to second configuration bitstream to form the extended second configuration bitstream are not used to configure the CLBs, IOBs, and programmable interconnect structure of the second design. FPGA 21 does not send the digits of the forcing value to configuration memory 23, but rather to an unused address of FPGA 21. The unused address can be in a circuit of FPGA 21 that is not being configured. Alternatively, the digits added to second configuration bitstream can be sent to addresses of block RAM that will be subsequently initialized by FPGA 21.

Figure 4B:
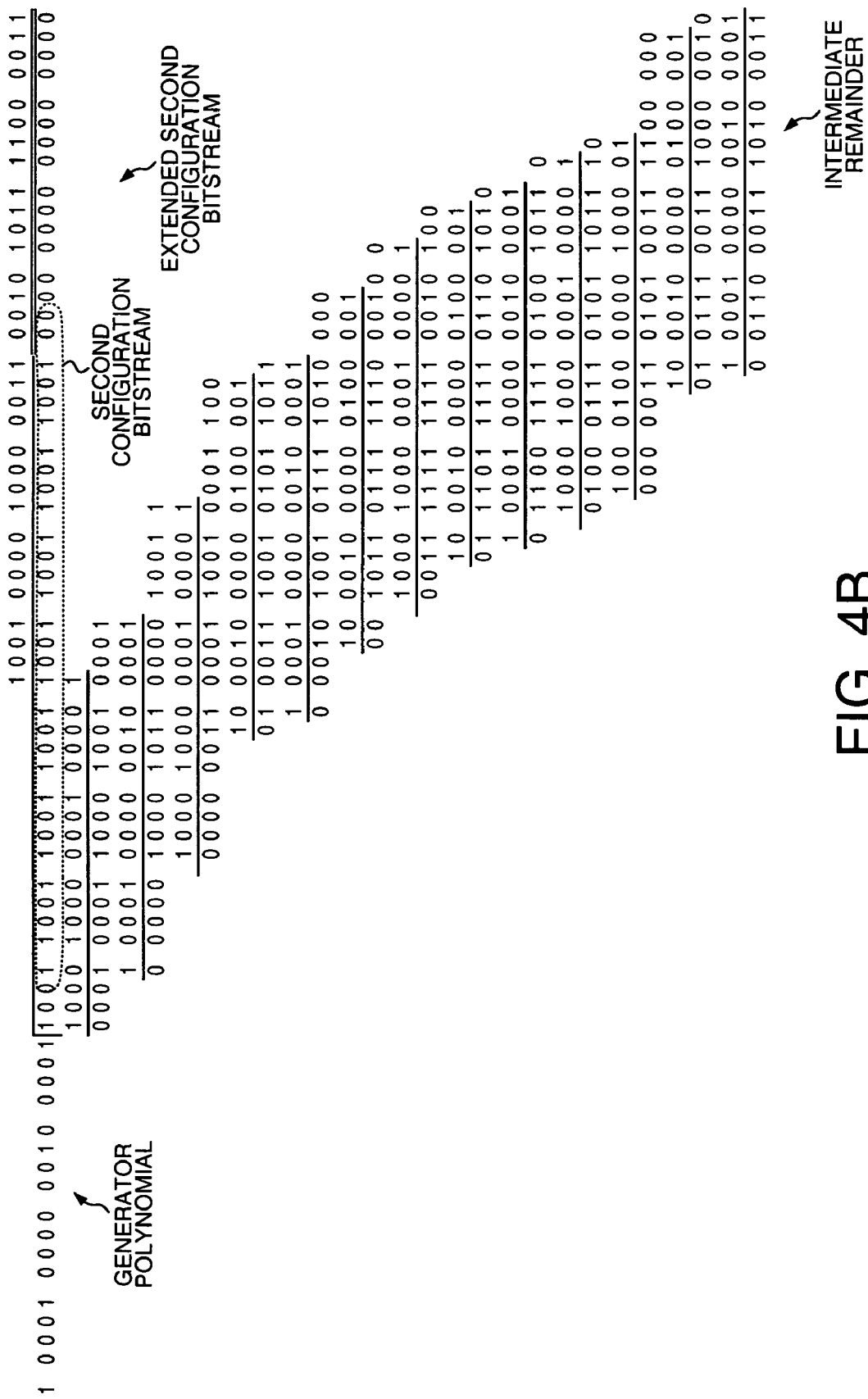

FIGS. 4A-D show a sample calculation employed in the operation of digital signature forcing circuit 10. In FIG. 4A, a first configuration bitstream 1010 1010 1010 1010 1010 1010 1010 1010 is divided by a generator polynomial 1 0001 0000 0010 0001, which can also be represented as $x^{16}+x^{12}+x^5+x^0$. The remainder resulting from the modulo-2 division is the first signature.

In FIG. 4B, a second configuration bitstream 1001 1001 1001 1001 1001 1001 1001 1001 is extended by 0000 0000 0000 0000 and then divided by the generator polynomial, resulting in an intermediate remainder. In FIG. 4C, the first signature is added to the intermediate remainder using modulo-2 addition to yield a forcing value.

Figure 4D:
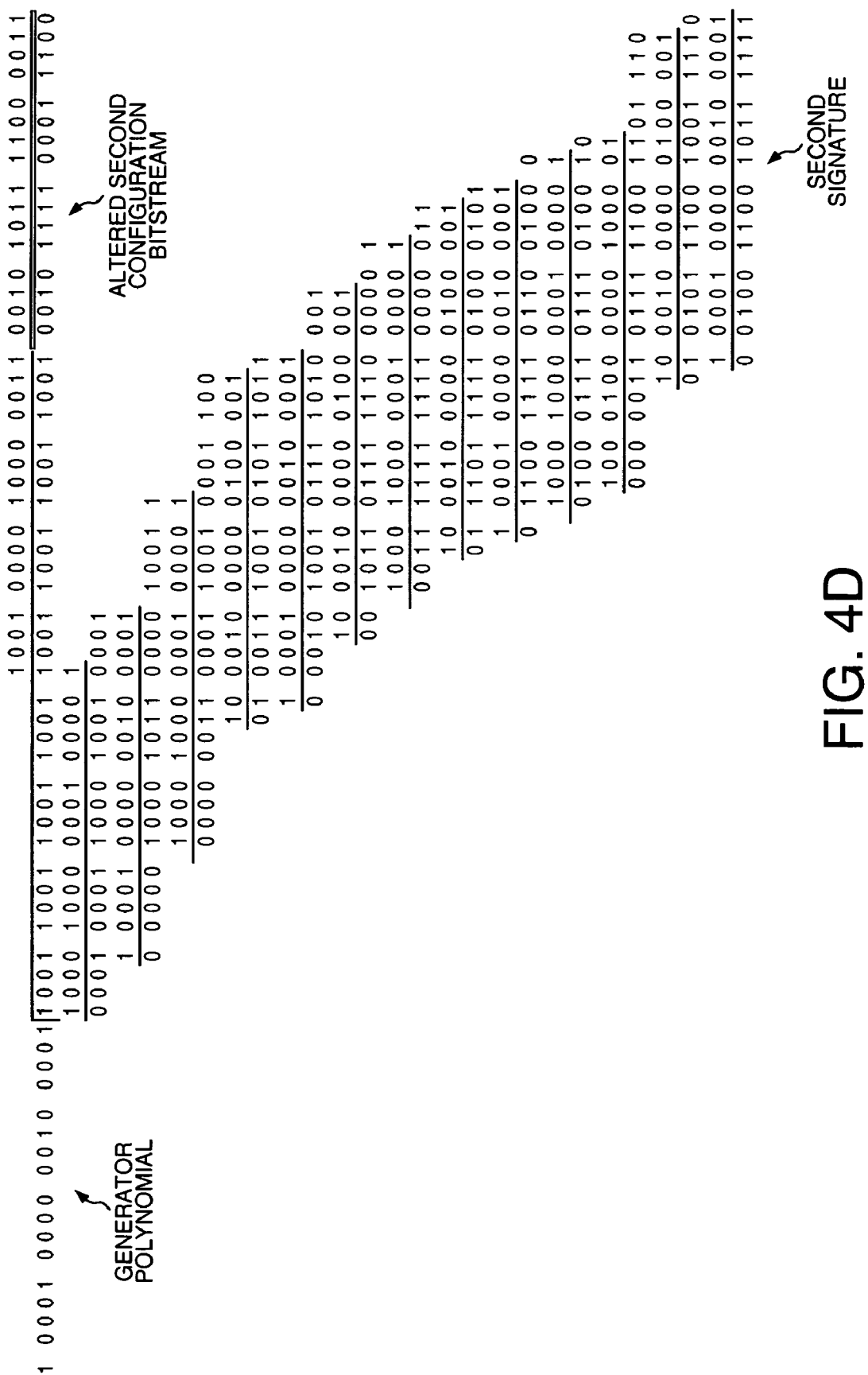

In FIG. 4D, the forcing value is added to the extended second configuration bitstream to yield an altered second configuration bitstream. When the altered second configuration bitstream is divided by the generator polynomial, the remainder is the second signature. The second signature is identical to the first signature.

In other embodiments, an additional check is used to dedicate a PLD for use with a certain configuration bitstream that corresponds to a tested design. In such a check, design verification circuitry 35 determines the length of a configuration bitstream by counting the number of words, bits, or frames. Design verification circuitry 35 then compares the resulting count against an allowed bitstream length. A bitstream that does not match the allowed length is rejected. Non-volatile memory 32 can be adapted to store values indicative of the allowed bitstream length.

Where the allowed length of the configuration bitstream is fixed, the method employed in digital signature forcing circuit 10 does not extend the second configuration bitstream. In an embodiment adapted for fixed-length configuration bitstreams, the first signature is determined in the same manner as previously described. Then, without first extending the second configuration bitstream, the second configuration bitstream is divided by the generator polynomial to yield a remainder. Each digital value in the Nth bit of the remainder is compared to the digital value in the Nth bit of the first signature. Then an altered second configuration bitstream is obtained by adding a logic one to each Nth bit of the second configuration bitstream for which the digital value in the Nth bit of the remainder differs from the value in the Nth bit of the first signature.

In an embodiment adapted for fixed-length configuration bitstreams, the last bits of the second configuration bitstream do not contain essential configuration data, and can be altered by digital signature forcing circuit 10 to facilitate using a PLD with a second design after the PLD has been dedicated for use with a first design. The number of bits that are potentially altered is the number of bits of the remainder, which can be up to one less than the number of bits in the generator polynomial.

Figure 5:
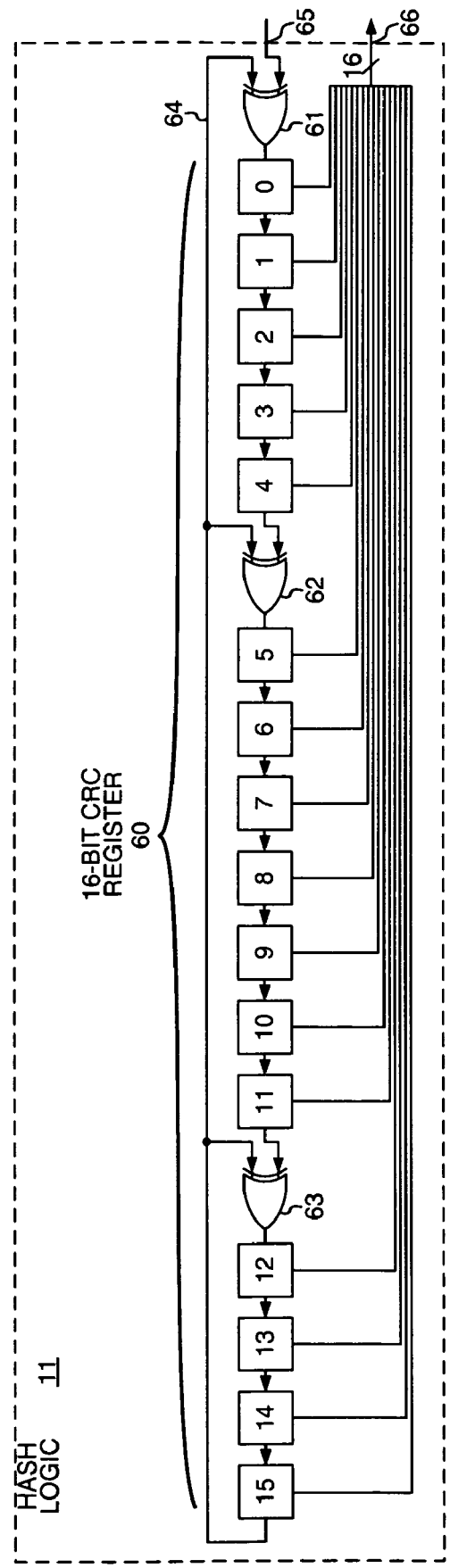
FIG. 5 is a simplified circuit diagram of a portion of the circuitry of the digital signature forcing circuit.

FIG. 5 is a simplified circuit diagram of a portion of the circuitry in one embodiment of hash logic 11. Hash logic 11 contains a CRC shift register 60 with sixteen flip-flops and three exclusive OR (XOR) gates 61-63. Hash logic 11 performs a hash function on the first configuration bitstream and on the extended second configuration bitstream. In this embodiment, the hash function is a modulo-2 division by generator polynomial $x^{16}+x^{12}+x^5+x^0$. Hash logic 11 performs the modulo-2 division using the three XOR gates 61-63, whose outputs are coupled to inputs of the flip-flops located at the 12th, 5th and 0th positions of CRC register 60. One of the inputs of each of XOR gates 61-63 is coupled through node 64 to the output of the flip-flop located at the 15th position of CRC register 60. The result of the division is a CRC checksum. When the division is performed on the first configuration bitstream, the resulting CRC checksum is the first signature. When the division is performed on the extended second configuration bitstream, the resulting CRC checksum is the intermediate remainder.

Hash logic 11 receives first configuration bitstream, as well as extended second configuration bitstream, bit-by-bit on input lead 65. In this embodiment, the first signature and the intermediate remainder are output on 16-bit output bus 66.

Figure 6:
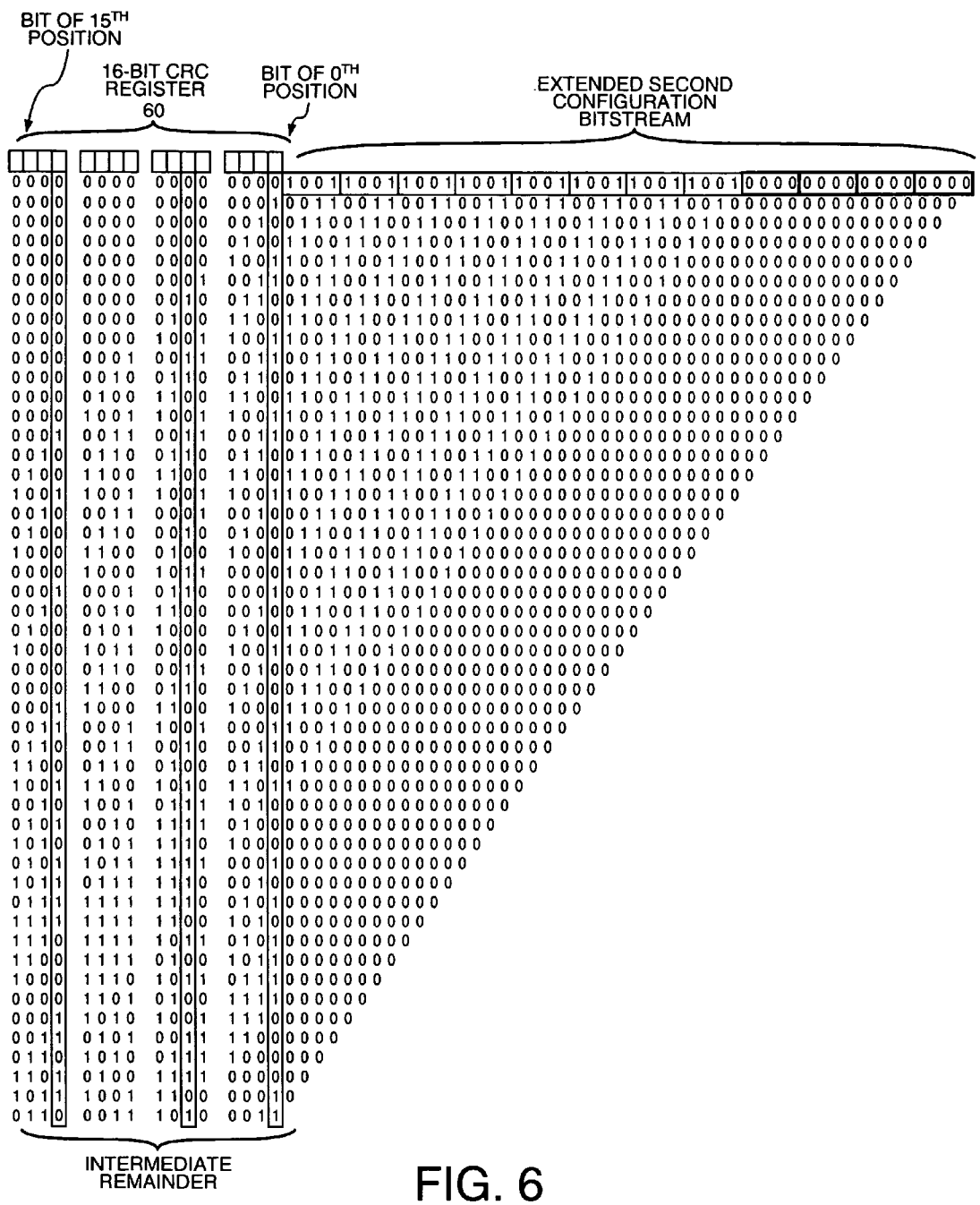
FIG. 6 is a table showing how the circuitry of FIG. 5 obtains the result of the calculation illustrated in FIG. 4B.

FIG. 6 shows how the circuitry of FIG. 5 performs modulo-2 division on the extended second configuration bitstream to obtain the intermediate remainder. Hash logic 11 operates on extended second configuration bitstream in a bit-by-bit manner and cascades the bits of second configuration bitstream down through the sixteen flip-flops of CRC register 60. When the last bit of the extended second configuration bitstream has been input into the flip-flop of 0th position, the digital logic values present in the sixteen flip-flops of CRC register 60 are the same values as the values of the intermediate remainder obtained by performing the longhand modulo-2 division illustrated in FIG. 4B. Hash logic 11 derives the first signature from the first configuration bitstream in an analogous manner.

In addition to using the CRC checksum (a hash value) of a configuration bitstream to dedicate a PLD for use with specific designs, the CRC checksum can also be used to verify the uncorrupted transmission of the configuration bitstream. The computed value of the CRC checksum is not only compared with the preset digital signature on the PLD, but it is also compared with a CRC value that is conveyed as part of the configuration bitstream. FPGA 21 performs this transmission check even if design verification circuitry 35 is disabled by programming memory cell 43 to store a logic zero. In another embodiment, the first signature is determined from the CRC value that is contained as part of the first configuration bitstream, and hash logic does not derive the first signature from the first configuration bitstream using a hash function.

Although in the embodiments described above, FPGA 21 receives the altered second configuration bitstream from digital signature forcing circuit 10, in other embodiments, digital signature forcing circuit 10 delivers the altered second configuration bitstream back to the external data source 28 from which the original first configuration bitstream was received. The external data source then supplies the altered second configuration bitstream to FPGA 21.

Although in the embodiments described above, digital signature forcing circuit 10 is a circuit made up of semiconductor components, in other embodiments, digital signature forcing is performed by a software program. The software program can run on a processor separate from FPGA 21. The software program performs the operations depicted in flowchart 50 of FIG. 3.

Although the present invention is described in connection with certain specific embodiments for instructional purposes, the present invention is not limited thereto. Although the invention is described in connection with employing cyclic redundancy check (CRC) algorithms, other hash functions can also be used. These other hash functions employ different methods for deriving the altered second configuration bitstream. Although one embodiment of the invention is adapted to applying a 16-bit generator polynomial, other embodiments employ hash functions that apply generator polynomials of other lengths, such as 32-bit generator polynomials. Moreover, the invention is applicable to data strings other than configuration bitstreams that configure PLDs. The invention can be used to redeploy any device that has been dedicated for use with a data string whose hash result matches an unchangeable value. Accordingly, various modifications, adaptations, and combinations of various features of the described embodiments can be practiced without departing from the scope of the invention as set forth in the following claims.

What is claimed is:

1. A method of altering a bit stream for configuring a programmable logic device (PLD) comprising:
storing a first signature derived by applying an algorithm to a first bitstream;
receiving a second bitstream;
wherein the first and second bitstreams implement different functionality on the PLD; and
altering the second bitstream to generate an altered second bitstream;
wherein altering the second bitstream does not change the functionality of the second bitstream and application of the algorithm to the altered second bitstream results in a second signature that is equal to the first signature.

2. The method of claim 1, wherein the algorithm is a cyclic redundancy check algorithm.

3. The method of claim 1, wherein the first signature is a checksum remainder resulting from dividing the first bitstream by a generator polynomial.

4. The method of claim 1, wherein the altering comprises:
appending a number of digital zero digits to an end of the second bitstream to generate an extended second bitstream;
dividing the extended second bitstream by a generator polynomial to generate an intermediate remainder; and
adding a forcing value to the extended second bitstream, wherein the forcing value equals the intermediate remainder plus the first signature.

5. The method of claim 4, wherein the first signature is generated by dividing the first bitstream by the generator polynomial.

6. The method of claim 4, wherein the dividing is performed using modulo-2 division and wherein the adding a forcing value is performed using modulo-2 addition.

7. The method of claim 1, wherein the altering comprises:
dividing the second bitstream by a generator polynomial to yield a remainder;
comparing a digital value in an Nth bit of the remainder to a digital value in an Nth bit of the first signature; and
adding a logic one to each Nth bit of the second bitstream for which the digital value in the Nth bit of the remainder differs from the value in the Nth bit of the first signature.

8. The method of claim 1, further comprising:
supplying the altered second bitstream to the PLD;
applying the algorithm to the altered second bitstream with circuitry on the PLD and outputting the second signature;
comparing the second signature to the first signature, wherein the first signature is stored on the PLD; and
enabling configuration of the PLD with the altered second bitstream in response to the second signature being equal to the stored first signature.

9. A computer-readable medium having computer-executable instructions for performing steps for altering a bitstream for configuring a programmable logic device (PLD) comprising:
storing a first signature derived by applying an algorithm to a first bitstream;
receiving a second bitstream;
wherein the first and second bitstreams implement different functionality on the PLD; and
altering the second bitstream to generate an altered second bitstream;

wherein altering the second bitstream does not change the functionality of the second bitstream and application of the algorithm to the altered second bitstream results in a second signature that is equal to the first signature.

10. The computer-readable medium of claim 9 having further computer-executable instructions for performing the steps of:

supplying the altered second bitstream to the PLD;

applying the algorithm to the altered second bitstream with circuitry on the PLD and outputting the second signature;

comparing the second signature to the first signature, wherein the first signature is stored on the PLD; and enabling configuration of the PLD with the altered second bitstream in response to the second signature being equal to the stored first signature.

* * * * *